United States Patent [19]

D'Amico et al.

[11] Patent Number: 4,457,951

[45] Date of Patent: Jul. 3, 1984

[54] ETCH SOLUTION AND METHOD

[75] Inventors: John F. D'Amico, Montgomery Township, Somerset County; Michael A. De Angelo, Ewing Township, Mercer County, both of N.J.

[73] Assignee: AT&T Technologies, Inc., New York, N.Y.

[21] Appl. No.: 546,713

[22] Filed: Oct. 28, 1983

[51] Int. Cl.$^3$ ............... B29C 17/08; C03C 15/00; B44C 1/22; B05D 5/12
[52] U.S. Cl. ................................ 427/96; 156/668; 252/79.2; 427/307
[58] Field of Search ............ 252/79.2; 156/655, 668, 156/644; 427/307, 96, 98, 97; 174/68.5; 29/829, 846; 204/192 EC, 30, 32 R, 192 R

[56] References Cited

U.S. PATENT DOCUMENTS

| | | | |
|---|---|---|---|
| 3,484,270 | 12/1969 | Saubestre et al. | 427/307 X |
| 3,620,804 | 11/1971 | Bauer et al. | 156/668 X |
| 3,808,028 | 4/1974 | Lando | 427/307 X |
| 4,144,119 | 3/1979 | Dutkewych et al. | 156/659.1 |
| 4,378,270 | 3/1983 | Brasch | 156/659.1 |

*Primary Examiner*—William A. Powell
*Attorney, Agent, or Firm*—J. F. Spivak

[57] ABSTRACT

In manufacturing a circuit which includes the step of etching a polymeric material in the presence of exposed metallic conductors, the polymer is etched with an aqueous solution comprising chromic acid [which may be added in the form of chromic oxide ($CrO_3$)], sulfuric acid, phosphoric acid and water wherein the water added does not exceed 55 volume percent of the total volume.

9 Claims, No Drawings

ETCH SOLUTION AND METHOD

TECHNICAL FIELD

This invention relates to etch solutions and particularly chromic acid-sulfuric acid type etch solutions useful in processing of multilayer printed circuit boards.

BACKGROUND OF THE INVENTION

In the wet chemical metallization of polymer coatings such as in the manufacture of printed circuit boards, polymer swell and etch steps are often used to enhance metal-to-polymer adhesion. A commonly used etchant for this purpose is a mixture of chromic acid and sulfuric acid which, operating at elevated temperatures, readily attacks the previously swelled polymeric materials and generates a microroughened surface for rooting the metal to be deposited thereon.

In the past, the swell-etch procedure was used on bare polymer surfaces, i.e., surfaces which had no exposed copper or other conductor. More recently, with the advent of multilayer printed circuit boards, the need to etch the polymer surface in an environment which includes exposed metal conductors has arisen. This is due to processing sequences which include the application of patterned polymer dielectric films, such as photodefinable polymers, over pre-deposited conductors followed by a metallization step over the polymer film. When employing standard aqueous chromic acid-sulfuric acid etch solutions, we unexpectedly discovered that a deeply etched trench formed in the exposed conductor at the boundary with the dielectric film. These trenches, if sufficiently enlarged, could break through the metal film, causing openings in the circuit or, if not that deep, could increase the resistance of the conductor or otherwise adversely affect the physical properties of the conductor. It therefore became necessary to modify or change the etch solution to attain an etchant for the polymer which, during the etching operation, would either not etch the metal conductor or etch it relatively slowly without significant trenching.

SUMMARY OF THE INVENTION

In manufacturing a circuit which includes the step of etching a polymeric material in the presence of exposed metallic conductors, the polymer is etched with an aqueous solution comprising chromic acid [which may be added in the form of chromic oxide ($CrO_3$)], sulfuric acid, phosphoric acid and water wherein the water added does not exceed 55 volume percent of the total volume.

DETAILED DESCRIPTION

As indicated above, typical prior art sulfuric acid-chromic acid etch solutions comprising about 35 volume percent concentrated sulfuric acid in an aqueous solution containing 65 volume percent water saturated or almost saturated with $CrO_3$ or an equivalent amount of a dichromate, resulted in the formation of deeply etched trenches in exposed copper surfaces directly adjacent the polymer to be etched. Attempts to elimate or reduce the etching of the copper while still maintaining etching of the polymer by reducing the concentration of sulfuric acid and/or chromic acid in the solution were unsuccessful. It was then discovered that by replacing a portion of the water of the prior art solutions with concentrated phosphoric acid, this trenching effect could be significantly reduced or eliminated while maintaining good etching of the polymer dielectric.

Typical etching solutions in accordance with this invention comprise from 30 to 38 volume percent concentrated sulfuric acid (about 96-98% $H_2SO_4$), 10 to 20 volume percent concentrated phosphoric acid (about 85% $H_3PO_4$), 100 grams per liter up to saturation of $CrO_3$ or its molar equivalent and 50 to 55 volume percent water (exclusive of the water content of the concentrated acids). By the molar equivalent of $CrO_3$ is meant an equivalent amount of moles of any other chromate which upon dissolution in the aqueous acidic media forms chromic acid. Generally, suitable etching solutions according to the invention have specific gravities above that of the previously mentioned prior art etching solutions. Typical ranges of specific gravity of the novel solutions are from about 1.49 to about 1.54. The use of phosphoric acid to replace the water of the prior art etch solutions is believed to aid in maintaining the Cr (VI) solubility in the bath necessary to adequately etch the polymer so as to preserve the attainable metal-polymer adhesion of subsequently applied metal films over the etched polymer, while significantly reducing the trenching phenomenon on previously existing exposed metallic conductors.

The novel etches were evaluated and compared with prior art and other etches based upon observations of the trenching phenomenon. It should be noted that even in trench-free etch solutions, some etching of the exposed copper occurs, but in a slow and uniform fashion that does not adversely affect the conductor. The observations of the phenomenon were made using a binocular microscope on patterned specimens (metallic and polymer patterns) cut into ½"×3" sections for swell and etch treatment. The specimen patterns were formed on epoxy-glass printed circuit board substrates having a copper foil base and a photodefinable polymeric dielectric pattern thereon. Subsequent to these observations, an electroless copper flash plating was applied over the etched substrate, the patterned conductors were built up by electroplating in acid copper sulfate, and peel strengths were determined. Commercial electroless and electroplating baths were employed. The results of the observations are tabulated below indicating T+ for severe wide and deep trenching, T for less severe trenching, T− for slight trenching OK− barely discernable trench and OK for no observable trenching of the exposed copper at the copper/polymer interface.

The samples were treated as follows: swell for 5 minutes at 35° C. in 65% dimethyl formamide, rinse, etch for 5 to 10 minutes at temperatures of from 45° to 55° C., rinse, neutralize, rinse, catalyze with MacDermid 9070 catalyst and 9071 accelerator and metallize with MacDermid 9085 electroless plating bath.

| | ETCH COMPOSITION | | | | | |
|---|---|---|---|---|---|---|
| | $CrO_3$ (g/l)/ Molar Conc. | $H_2SO_4$ Vol. Frac./ Molar Conc. | $H_3PO_4$ Vol. Frac./ Molar Conc. | $H_2O$ Vol. Frac./ Molar Conc. | Etch Conditions | Obs. |
| 1. | 144/1.44 | 0.35/6.37 | 0.00/0.00 | 0.65/37.23 | 5',55° C. | T |
| 2. | 144/1.44 | 0.25/4.55 | 0.10/1.61 | 0.65/38.45 | 5',55° C. | T+ |

-continued

| | ETCH COMPOSITION | | | | | |
|---|---|---|---|---|---|---|
| | $CrO_3$ (g/l)/ Molar Conc. | $H_2SO_4$ Vol. Frac./ Molar Conc. | $H_3PO_4$ Vol. Frac./ Molar Conc. | $H_2O$ Vol. Frac./ Molar Conc. | Etch Conditions | Obs. |
| 3. | 144/1.44 | 0.10/1.82 | 0.25/4.03 | 0.65/40.28 | 5',55° C. | T |
| 4.* | 144/1.44 | 0.00/0.00 | 0.35/5.64 | 0.65/41.5 | 5',55° C. | OK |
| 5. | 140/1.40 | 0.35/6.37 | 0.05/0.80 | 0.60/34.33 | 10',47° C. | T− |
| 6. | 140/1.40 | 0.35/6.37 | 0.10/1.61 | 0.55/33.20 | 10',47° C. | OK− |
| 7. | 140/1.40 | 0.35/6.37 | 0.15/2.42 | 0.50/31.18 | 10',47° C. | OK |
| 8. | 140/1.40 | 0.30/5.46 | 0.20/3.22 | 0.50/31.79 | 10',47° C. | OK |
| 9a. | 140/1.40 | 0.35/6.37 | 0.10/1.61 | 0.55/33.2 | 10',47° C. | OK |
| b. | 134.4/1.344 | 0.336/6.11 | 0.096/1.55 | 0.568/34.1 | 10',47° C. | T |
| c. | 128/1.28 | 0.357/6.50 | 0.102/1.64 | 0.541/32.75 | 10',47° C. | OK |
| 10a. | 140/1.40 | 0.35/6.37 | 0.10/1.61 | 0.55/33.2 | 10',47° C. | T− |
| b. | 138.6/1.386 | 0.347/6.31 | 0.109/1.75 | 0.545/33.0 | 10',47° C. | T− |
| c. | 136.1/1.361 | 0.340/6.19 | 0.125/2.01 | 0.535/32.7 | 10',47° C. | OK− |
| d. | 134.2/1.342 | 0.336/6.11 | 0.137/2.21 | 0.527/32.5 | 10',47° C. | OK− |
| e. | 132.4/1.324 | 0.331/6.03 | 0.149/2.39 | 0.520/32.2 | 10',47° C. | OK− |
| 11a. | 144/1.44 | 0.35/6.37 | 0.0/0.00 | 0.65/39.50 | 10',47° C. | T |
| b. | 139.4/1.394 | 0.371/6.75 | 0.0/0.00 | 0.629/36.12 | 10',47° C. | T |
| c. | 137.4/1.374 | 0.380/6.91 | 0.0/0.00 | 0.62/35.67 | 10',47° C. | T |
| d. | 136.0/1.36 | 0.376/6.84 | 0.01/0.17 | 0.614/35.46 | 10',47° C. | T |
| e. | 130.5/1.305 | 0.360/6.56 | 0.05/0.81 | 0.589/34.64 | 10',47° C. | T |
| f. | 124.3/1.243 | 0.343/6.25 | 0.096/1.54 | 0.561/33.72 | 10',47° C. | T |
| g. | 118.6 | 0.328/5.96 | 0.137/2.21 | 0.535/32.90 | 10',47° C. | T− |
| h. | 113.4 | 0.313/5.70 | 0.175/2.82 | 0.512/32.11 | 10',47° C. | OK− |
| i. | 105.4 | 0.362/6.58 | 0.163/2.62 | 0.476/30.05 | 10',47° C. | OK |

*No trenching but failed to etch polymer

Note:
Volume fraction given as volume of concentrated acids and water added. It does not correct for water content in the concentrated acids.
Molar concentration is based upon actual number of moles of constituent and hence does correct for water content in the concentrated acids, the number of moles of such water being added to the moles of pure water used in making the solution. No correction in volume is made due to $CrO_3$ addition, as this was found negligible upon completion of the final composition.

Peel strength determinations subsequent to plating indicated equivalent peel strength after use of the novel etch solutions as compared with the prior art etch solution.

It may be noted that while trenching can be eliminated at water levels greater than 0.55 parts water with low sulfuric acid levels, in such cases the sulfuric acid level then becomes too low to etch the polymer surface as desired. Consequently, in order to maintain polymer etch performance and eliminate or substantially reduce trenching of exposed conductors, it was unexpectedly found that the level of water in the etch solution was critical and that, as compared with the prior art baths, the water must be replaced with phosphoric acid to give the proper molar ratios of each of the constituents. The amount of $CrO_3$ added to the solution can vary between the amount which gives an adequate etch rate and saturation. Generally this is between about 90 and 150 grams/liter.

In practical application, e.g., the manufacture of multilayer printed circuit boards, the circuit board substrate having a conductive layer thereon, e.g., a copper foil clad layer or one formed by electroless plating techniques is coated, in a desired pattern, with a photodefinable polymeric dielectric. The underlying conductor can be patterned or can be a blanket ground plane conductor. The polymeric dielectric is then swelled, e.g., with dimethyl formamide and etched with the novel solution. After neutralizing and rinsing the surface subsequent to the etch, a copper layer (usually but not necessarily patterned) is applied over the etched surface. This layer may be applied by any available technique, e.g., electroless plating, vacuum evaporation, sputtering and the like. It should be noted that often micro vias or other through holes may be provided in the dielectric, generally prior to the swell-etch. The steps of applying dielectric, swell-etching and plating may be repeated any number of times so as to result in a multilayer ciruit board.

EXAMPLE

A printed circuit board comprising a laminated copper foil on a polymeric substrate is cleaned and coated with a dielectric in a desired pattern by any of the well-known techniques. The patterned dielectric is then treated to swell its surface, e.g., with a 65% dimethyl formamide solution, for 5 to 10 minutes at 35°–55° C. The swelled surface is water rinsed and then etched, e.g., for 10 minutes at 45°–50° C., with a solution comprising 35 volume percent concentrated $H_2SO_4$, 10 volume percent concentrated $H_3PO_4$, 55 volume percent $H_2O$ nd 140 g per liter $CrO_3$. (It should be noted that the volume percent $H_2O$ refers only to the pure water added and does not take into account the 2–4% water in concentrated $H_2SO_4$ and about 15% water in concentrated $H_3PO_4$.) The etched surface is rinsed, neutralized with a warm (55° C.) 4N NaOH solution, and rinsed again. The surface is then treated with 30% HCl at room temperature for two minutes followed by a five minute immersion in a commercially available electroless plating catalyst, e.g., MacDermid 9070. After another rinse the surface is treated with an accelerator, e.g., MacDermid 9071, rinsed and metallized in an electroless plating bath, e.g., MacDermid 9085. The steps of applying the polymeric dielectric, e.g., a photodefinable epoxy acrylate, through electroless plating may then be repeated.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. An aqueous polymer etch solution comprising chromic acid, sulfuric acid, phosphoric acid and water wherein the water does not exceed 0.55 volume percent and wherein the quantity of sulfuric acid and chromic acid are sufficient to etch the polymer.

2. The solution recited in claim 1 wherein the chromic acid is formed by the addition of chromium trioxide.

3. An aqueous etch solution comprising 30-38 volume percent concentrated $H_2SO_4$, 10-20 volume percent concentrated $H_3PO_4$, 90 g/l-saturation $CrO_3$ or its molar equivalent and 50-55 volume percent $H_2O$ exclusive of the water content of the concentrated acids.

4. The etch solution recited in claim 1 having a specific gravity of from about 1.49 to about 1.54.

5. The etch solution recited in claim 3 having a specific gravity of from about 1.49 to about 1.54.

6. A method for manufacturing a circuit including the step of etching a polymeric material in the presence of exposed metallic conductors with an etch solution comprising chromic acid, sulfuric acid, phosphoric acid and water wherein the water does not exceed 55 volume percent of the total etch solution and the specific gravity is from about 1.49 to about 1.54.

7. The method recited in claim 6 wherein the etch solution comprises the equivalent of 30-38 volume percent concentrated $H_2SO_4$, 10-20 volume percent concentrated $H_3PO_4$, 50-55 volume percent $H_2O$ and a member of the group consisting of chromic acid and a chromic acid forming oxide in a molar amount equivalent to from 90 g/l $CrO_3$ to saturation.

8. A method of manufacturing a multilayer circuit on a substrate having a conductive layer thereon including the steps of forming in a desired pattern a polymeric dielectric layer over the substrate and conductive layer, swelling the polymer surface with an appropriate swelling agent, etching the swelled polymer with an etch solution comprising chromic acid, sulfuric acid, phosphoric acid and water wherein the water does not exceed 0.55 volume percent and wherein the quantity of sulfuric acid and chromic acid are sufficient to etch the polymer, rinsing and neutralizing the surface, and forming a conductive coating over the surface in a desired pattern.

9. The method recited in claim 8 wherein the etch solution comprises the equivalent of 30-38 volume percent concentrated $H_2SO_4$, 10-20 volume percent concentrated $H_3PO_4$, 50-55 volume percent $H_2O$ and a member of the group consisting of chromic acid and a chromic acid forming oxide in a molar amount equivalent to from 90 g/l $CrO_3$ to saturation.

* * * * *